United States Patent

Shinmori

[19]

[11] Patent Number: 6,107,846
[45] Date of Patent: Aug. 22, 2000

[54] FREQUENCY MULTIPLICATION CIRCUIT

[75] Inventor: Nobuaki Shinmori, Tokyo, Japan

[73] Assignee: Oki Electric Industry Co., Ltd., Tokyo, Japan

[21] Appl. No.: 08/965,410

[22] Filed: Nov. 6, 1997

[30] Foreign Application Priority Data

May 21, 1997 [JP] Japan .................................. 9-131102

[51] Int. Cl.[7] .............................................. H03B 19/00
[52] U.S. Cl. ....................... 327/116; 327/119; 327/356; 377/47
[58] Field of Search ........................... 327/116, 119–122, 327/356; 377/47, 48

[56] References Cited

U.S. PATENT DOCUMENTS

| | | | |
|---|---|---|---|
| 4,423,383 | 12/1983 | Svendsen | 327/115 |
| 5,122,757 | 6/1992 | Weber et al. | 327/105 |
| 5,598,446 | 1/1997 | Van Der Tuijn | 327/2 |
| 5,761,255 | 6/1998 | Shi | 327/142 |
| 5,841,823 | 11/1998 | Tuijn | 327/160 |

*Primary Examiner*—Kenneth B. Wells
*Attorney, Agent, or Firm*—Rabin & Champagne, P.C.

[57] ABSTRACT

A frequency multiplication circuit generates an output clock signal having a frequency obtained by multiplying an external clock signal inputted from outside by a predetermined number. The frequency multiplication circuit circuit includes an edge detection circuit for detecting a signal edge of the external clock signal and outputting an edge detection signal, an oscillation circuit for generating and outputting a reference clock signal having a predetermined frequency, and a clock generating circuit for taking in the edge detection signal outputted by the edge detection circuit and the reference clock signal outputted by the oscillation circuit, counting the number of clocks of the reference clock signal, directly outputting the reference clock signal before the number of clocks reaches a predetermined number, outputting no reference clock signal after the number of clocks has reached the predetermined number, and resetting a process of counting the number of reference clocks when inputting the edge detection circuit.

14 Claims, 11 Drawing Sheets

FREQUENCY MULTIPLICATION CIRCUIT

BACKGROUND OF THE INVENTION

The present invention relates to a frequency multiplication circuit for generating an output clock signal containing a frequency into which an outside clock signal is multiplied by a predetermined numerical value.

With an advancement of a semiconductor technology over the recent years, it has been a tendency that an operating frequency of an integrated circuit of a microprocessor, a microcontroller and so on. Accordingly, an oscillator for supplying the integrated circuit with the operating frequency is required to generate a clock signal having a higher frequency. When making an attempt to increase the frequency of the clock signal generated by the oscillator, however, there arise such drawbacks that the electric power consumed by the oscillator increases, and that radiation noises produced within the oscillator augment.

A method involving the use of a frequency multiplication circuit has hitherto been known as a method of obviating those drawbacks. According to this method, the clock signal generated by the oscillator having a comparatively low frequency is used as a system clock in an electronic circuit and an electronic appliance that are mounted with a microprocessor and a microcontroller, and a clock signal obtained by multiplying this system clock in a frequency multiplication circuit is employed as an operating clock of the microprocessor and the microcontroller.

FIG. 11 is a block diagram showing one example of a construction of the prior art frequency multiplication circuit.

Referring to FIG. 11, a voltage control oscillation circuit 1101 output s clock signal of a frequency corresponding to a signal voltage inputted from a loop filter 1106. Then, this clock signal is outputted to outside as an output clock signal CLK2 via a clock driver 1102, and at the same time inputted to an N-bit up-counter 1103. Upon this process, the up-counter 1103 counts the number of clocks of the signals outputted from the voltage control oscillation circuit 1101. Then, when this count value reaches a predetermined value, a signal level of a most-significant-bit signal SN-1 of the up-counter 1103 changes from low to high.

A phase detection circuit 1104 inputs the most-significant-bit signal SN-1 from the up-counter 1103 and also an external clock signal CLK1 from outside, and compares phases of these two signals SN-1 and CLK1. Then, a signal Sp indicating a result of detecting a phase difference between the two signals SN-1 and CLK1, is outputted.

A charge pump circuit 1105 inputs this signal Sp and converts it into a voltage signal VC for controlling the above voltage control oscillation circuit 1101. Subsequently, a waveform of this voltage signal VC is shaped by the loop filter 1106 and thereafter inputted to the voltage control oscillation circuit 1101.

According to the thus constructed frequency multiplication circuit, if the phase of the output signal SN-1 of the up-counter 1103 is faster than the phase of the external clock signal CLK1, the frequency of the clock signal generated by the voltage control oscillation circuit 1101 decreases. Whereas if the phase of the output signal SN-1 of the up-counter 1103 is slower than the phase of the external clock signal CLK1, the frequency of the clock signal generated by the voltage control oscillation circuit 1101 increases. Then, the frequency of the clock signal generated by the voltage control oscillation circuit 1101 can be thereby made coincident precisely with an N-fold value of the frequency of the external clock signal CLK1.

The prior art frequency multiplication circuit as illustrated in FIG. 11 has, however, a drawback of increasing both a size and a price of the circuit because of a large number of elements.

Further, it is required that the voltage control oscillation circuit 1101, the charge pump circuit 1105 and the loop filter 1106 be constructed of analog circuits, and hence it is difficult to make a power supply in use compatible with other circuits (i.e., digital circuits). This is also one of the factors to bring about the increases both in the size and in the price of the circuit. Namely, the power supply for operating those analog circuits 1101, 1105, 1106 must be provided separately from a power supply for operating the digital circuits, and therefore totally two units of power supplies are to be required as the case may be.

Moreover, the frequency multiplication circuit shown in FIG. 11 is limited in terms of an external clock signal frequency range enough to match with the voltage control oscillation circuit 1101, and therefore possesses such a drawback that the frequency range of the usable external clock signal is small.

For this reason, there has hitherto been desired a frequency multiplication circuit that is small in circuitry size, constructible of only a digital circuit, and has a wider frequency range of the usable external clock signal.

SUMMARY OF THE INVENTION

It is a primary object of the present invention to provide a frequency multiplication circuit for generating an output clock signal having a frequency obtained by multiplying an external clock signal inputted from outside by a predetermined number.

To accomplish this object, according to one aspect of the present invention, a frequency multiplication circuit comprises an edge detection circuit for detecting a signal edge of the external clock signal and outputting an edge detection signal, an oscillation circuit for generating and outputting a reference clock signal having a predetermined frequency, and a clock generating circuit for taking in the edge detection signal outputted by the edge detection circuit and the reference clock signal outputted by the oscillation circuit, counting the number of clocks of the reference clock signal, directly outputting the reference clock signal before the number of clocks reaches a predetermined number, outputting no reference clock signal after the number of clocks has reached the predetermined number, and resetting a process of counting the number of reference clocks when inputting the edge detection circuit.

According to the construction given above, the frequency multiplication circuit employs only circuits capable of obtaining a construction involving the use of logic circuits, and can be therefore constructed of only digital circuits in small circuitry size. Further, no voltage control oscillation circuit is required, and hence there is no necessity for restricting a frequency range of a usable external clock signal.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Embodiments of the present invention will hereinafter be described with reference to the accompanying drawings. Note that sizes and configurations of respective components, and a relationship in disposition therebetween are just schematically illustrated to such an extent that the present invention is understandable. It should also be understood that numerical conditions explained hereinbelow are nothing but simple exemplifications.

First Embodiment

A first embodiment of the present invention will hereinafter be discussed with reference to FIGS. 1 and 2.

Figure 1:
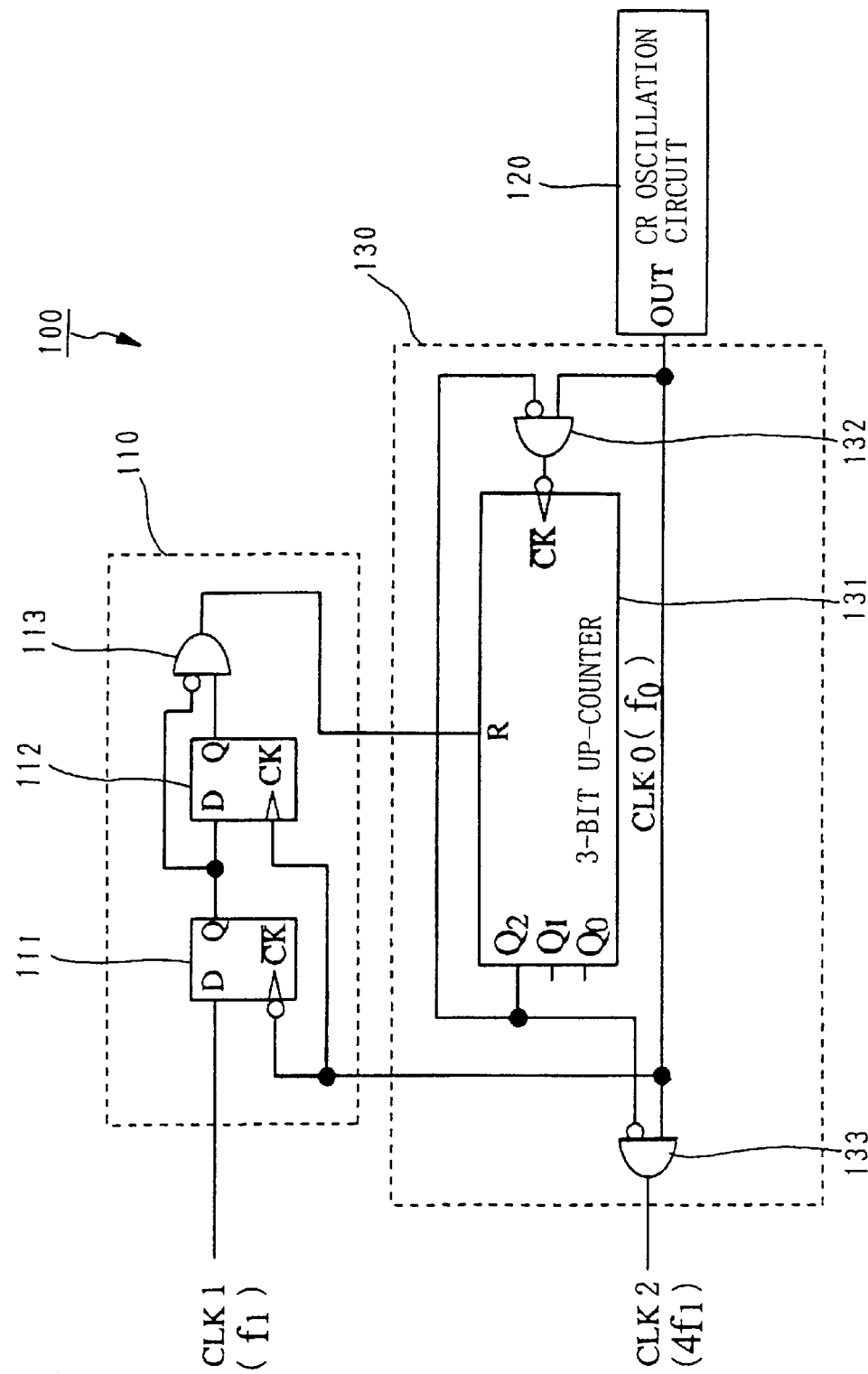
FIG. 1 is a circuit diagram showing a construction of a frequency multiplication circuit in a first embodiment.

FIG. 1 is a circuit diagram showing a construction of a frequency multiplication circuit in accordance with the first embodiment.

As illustrated in FIG. 1, a rising edge detection circuit 110 in a frequency multiplication circuit 100 includes delay-type flip-flops 111, 112 and a logic gate 113. Herein, the delay-type flip-flop 111 inputs an external clock signal CLK1 (with a frequency designated by "f1") from an input terminal D, and has an inversion clock input terminal CK(BAR) connected to a clock signal output terminal OUT of a CR oscillation circuit 120 (which will be mentioned later). The input terminal D of the delay-type flip-flop 112 is connected to an output terminal Q of the delay-type flip-flop 111, and a clock input terminal CK thereof is connected to the clock signal output terminal OUT of the CR oscillation circuit 120. The logic gate 113 includes an active-low input terminal connected to the output terminal Q of the delay-type flip-flop 111, and an active-high input terminal connected to the output terminal Q of the delay-type flip-flop 112, respectively. Herein, this logic gate 113 is constructed to output a high-level signal only when the output Q of the delay-type flip-flop 111 takes a low level and when the output Q of the delay-type flip-flop 112 takes a high level, and to output a low-level signal in other cases. Then, an output of this logic gate 113 becomes an "edge detection signal" according to the present invention.

Further, the CR oscillation circuit 120 is constructed of, e.g., a non-stable multivibrator. The non-stable multivibrator may be constructed of a capacitor C, a resistance R and a NOT gate if, e.g., a TTL (Transistor-Transistor Logic) is employed. A specific construction of this multivibrator is already known, and therefore its explanation is omitted. A clock signal CLK0 having a frequency f0, which is outputted by the CR oscillation circuit 120, becomes a "reference clock signal" according to the present invention.

A clock generation circuit 130 consists of a 3-bit up-counter 131 and logic gates 132, 133. Herein, a reset input terminal R of the up-counter 131 is connected to an output terminal of the logic gate 113 provided in a falling edge detection circuit 110, and a clock input terminal CK(BAR) thereof is connected to an output terminal of the logic gate 132.

Then, an active-low input terminal of this logic gate 132 is connected to a most-significant-bit output terminal Q2 of the up-counter 131, while an active-high output terminal thereof is connected to an output terminal OUT of a CR oscillation circuit 120, respectively. Herein, the logic gate 132 is constructed to output a high-level signal only when an output Q2 of the up-counter 131 assumes a low level and when the reference clock signal CLK0 outputted by the CR oscillation circuit 120 assumes a high level, and to output a low-level signal in other cases.

On the other hand, the active-low input terminal of the logic gate 133 is connected to the most-significant-bit output terminal Q2 of the up-counter 131, and the active-high input terminal thereof is connected to the output terminal OUT of the CR oscillation circuit 120. This logic gate 133 is also constructed to output the high-level signal only when the output Q2 of the up-counter 131 takes the low level and when the reference clock signal CLK0 outputted by the CR oscillation circuit 120 takes the high level, and to output the low-level signal in cases other than the above-mentioned. Note that nothing is connected to the 1-bit output terminals Q0, Q1 of the up-counter 131.

Next, an operation of the frequency multiplication circuit illustrated in FIG. 1 will be explained referring to a timing chart in FIG. 2.

Figure 2:
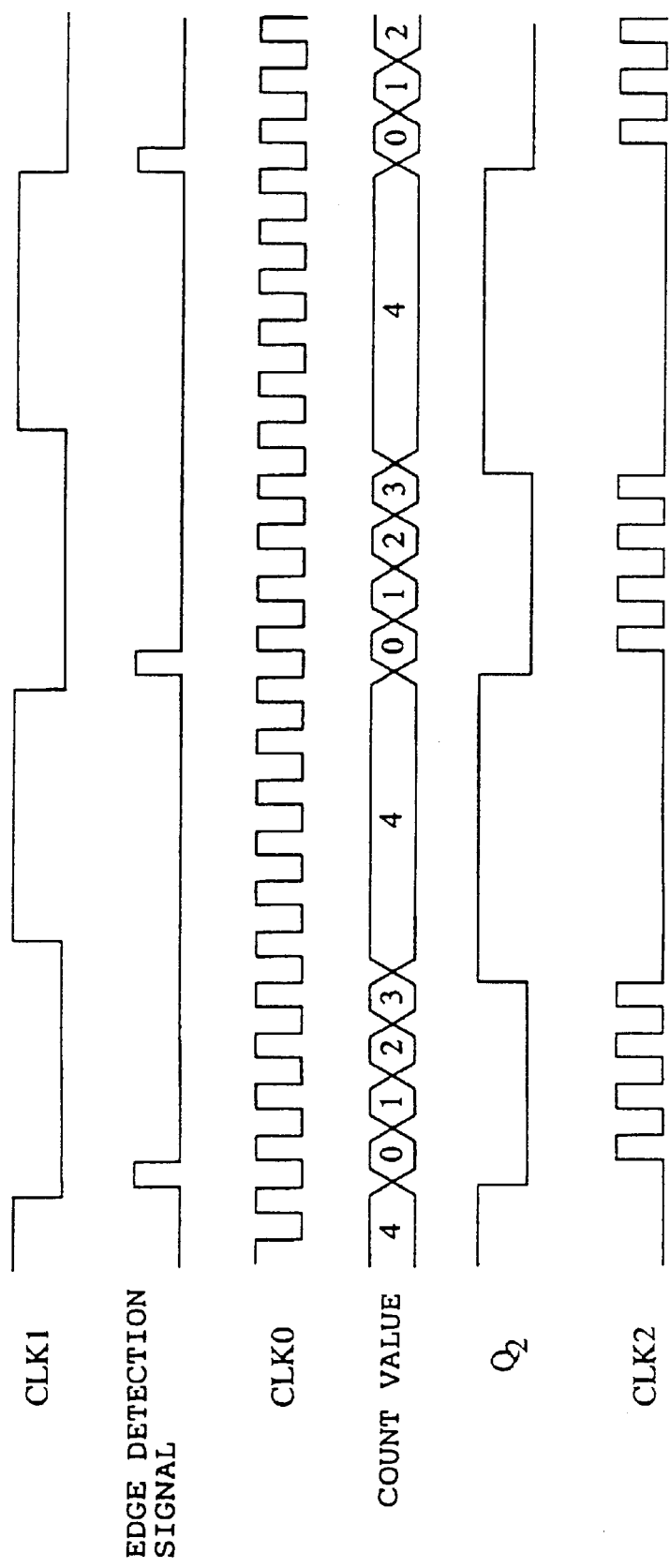
FIG. 2 is an explanatory timing chart showing an operation of the frequency multiplication circuit in the first embodiment.

As shown in FIG. 2, the CR oscillation circuit 120 generates and always outputs the reference clock signal CLK0 having the frequency f0 well higher than a frequency f1 of the external clock signal CLK1.

The delay-type flip-flop 111 of the falling edge detection circuit 110 takes in the external clock signal CLK1 at a fall timing of the reference clock signal CLK0. Further, the delay-type flip-flop 112 takes in the output Q of the delay-type flip-flop 111 at a rise timing of the reference clock signal CLK0. Accordingly, a signal level of the external clock signal CLK1 taken in by the delay-type flip-flop 111, is then taken in by the delay-type flip-flop 112 after a passage of 1/(2f0). Therefore, when the delay-type flip-flop 111 takes in the signal level of the external clock signal CLK1, it follows that the delay-type flip-flop 112 holds the signal level taken in last time by the delay-type flip-flop 111. p Herein, supposing that the signal level of the external clock signal CLK1 taken in by the delay-type flip-flop 111 is consecutively high twice, both of the outputs Q of the delay-type flip-flops 111, 112 come to take the high level. Accordingly, the output (i.e., the edge detection signal) of the logic gate 113 becomes the low level.

Next, assuming that the signal level of the external signal CLK1 changes from high to low, the delay-type flip-flop 111 takes in the external clock signal CLK1 taking the low level at a fall timing of the first reference clock signal CLK0 after this change has occurred. On the other hand, the signal level held at this time by the delay-type flip-flop 112 is high. The output Q of the delay-type flip-flop 111 thereby becomes the low level, while the output Q of the delay-type flip-flop 112 becomes the high level. Therefore, the signal level of the edge detection signal outputted by the logic gate 113 becomes high.

Then, the output Q of the delay-type flip-flop 112 takes the low level after the passage of 1/(2f0). After a further passage of 1(2f0), the delay-type flip-flop 111 again takes in the external clock signal CLK1 taking the low level. At this moment, both of the outputs Q of the delay-type flip-flops 111, 112 take the high level, and hence the signal level of the edge detection signal outputted by the logic gate 113 changes from high to low.

The up-counter 131 of the clock generation circuit 130 inputs the edge detection signal outputted by the logic gate 113 from the reset terminal. Then, a count value is reset at a rise timing of this edge detection signal. All bit outputs Q0, Q1, Q2 of the up-counter 131 thereby take the low level (which corresponds to a count value "0").

The logic gate 132 inputs the output Q2 among those bit outputs from the active-low input terminal, and inputs the reference clock signal CLK0 outputted by the CR oscillation circuit 120 from the active-high input terminal. Accordingly, when the output Q2 of the up-counter 131 is at the low level, the output of the logic gate 132 becomes the high level if the reference clock signal CLK0 is at the high level but the low level if at the low level. Namely, when the bit output Q2 of the up-counter 131 is at the low level, the reference clock signal CLK0 outputted by the CR oscillation circuit 120 is inputted directly to the clock input terminal CK(BAR) of the up-counter 131.

Further, the logic gate 133, as in the case of the logic gate 132, also inputs the output Q2 of the up-counter 131 from the active-low input terminal, and inputs the reference clock signal CLK0 outputted by the CR oscillation circuit 120 from the active-high input terminal. Accordingly, when the output Q2 of the up-counter 131 is at the low level, the output of the logic gate 133 becomes the high level if the reference clock signal CLK0 is at the high level but the low level if at the low level. Namely, when the bit output Q2 of the up-counter 131 is at the low level, the reference clock signal CLK0 outputted by the CR oscillation circuit 120 is outputted directly from the output terminal of the logic gate and becomes an output clock signal CLK2.

The up-counter 131 increments the count value by "+1" at the fall timing of the reference clock signal CLK0 inputted from the clock input terminal CK(BAR). Then, this count value comes to "4" (viz., "100" in binary number), at which time the most-significant-bit output Q2 changes from the low level to the high level. The output of the logic gate 132 thereby becomes the low level irrespective of the signal level of the reference clock signal CLK0 outputted by the CR oscillation circuit 120. Therefore, since the input signal from the clock input terminal CK(BAR) is fixed at the low level, the up-counter 131 stops counting.

Similarly, when the output Q2 of the up-counter 131 changes from the low level to the high level, the output of the logic gate 133 is also fixed at the low level regardless of the signal level of the reference clock signal CLK0 outputted by the CR oscillation circuit 120.

Thereafter, the falling edge detection circuit 110 again detects the falling edge of the external clock signal CLK2, and the up-counter 131 is reset. Thereupon, the up-counter 131 resumes the counting process in the same way as the above-mentioned, and the logic gate 133 resumes outputting the output clock signal CLK2.

Herein, the logic gate 133, as explained above, outputs the output clock signal CLK2 only when the output of the most significant bit Q2 of the up-counter 131 is at the low level, i.e., only when the count values are "0", "1", "2" and "3" ("000", "001", "010" and "011" in the binary numbers), and hence four clock signals are outputted during one period (1/f1) of the external clock signal CLK1. That is to say, the frequency multiplication circuit 100 illustrated in FIG. 1 is capable of generating the output clock signal CLK2 having the frequency (4f1) that is four times as high as the external clock signal CLK1.

Thus, the frequency multiplication circuit in the first embodiment can be constructed of only the single CR oscillation circuit 120, the single up-counter 131, the two delay-type flip-flops 111, 112, and the three logic gates 113, 132, 133. It is therefore possible to reduce the circuitry size as compared with the prior art frequency multiplication circuit.

Further, the frequency multiplication circuit can be constructed of only the digital circuits as shown in FIG. 1, and therefore the power supply, etc. is usable in common to other circuits. In this respect also, the circuitry size can be reduced.

Moreover, all the external clock signals CLK1 are usable on condition that the signals CLK1 have frequencies lower than a value obtained by dividing, by a multiple ("4" in the first embodiment), the reference clock signal CLK0 generated by the CR oscillation circuit 120. Consequently, the range of the frequency f1 of the usable external clock signal CLK1 can be widened.

Incidentally, the multiple is set to "4" in the first embodiment, and therefore the 3-bit up-counter 131 is used as an up-counter. As a matter of course, counters having numbers of bits other than "3" are usable. For instance, when the multiple is set to "8", a 4-bit counter may be employed. When the multiple is set to "16", a 5-bit counter may be used.

Further, the logic gates 132, 133 are controlled by use of the most-significant-bit output Q2 of the up-counter 131, however, the most-significant-but output is not necessarily used. For example, a frequency multiplication circuit with a multiple of "4" can be obtained also by using a bit of the third digit of the 4-bit up-counter.

Moreover, in accordance with the first embodiment, the delay-type flip-flop 111 operates at the fall timing of the reference clock signal CLK0, and the delay-type flip-flop 112 operates at the rise timing of the reference clock signal CLK0. As a matter of course, however, the operation timings of the two flip-flops 111, 112 may be reversed.

Second Embodiment

Next, a second embodiment of the present invention will be described with reference to FIGS. 3 and 4.

The second embodiment is different from the first embodiment in terms of such points that a rising edge detection circuit is used as an edge detection circuit, and that a down-counter is employed as a counter.

Figure 3:
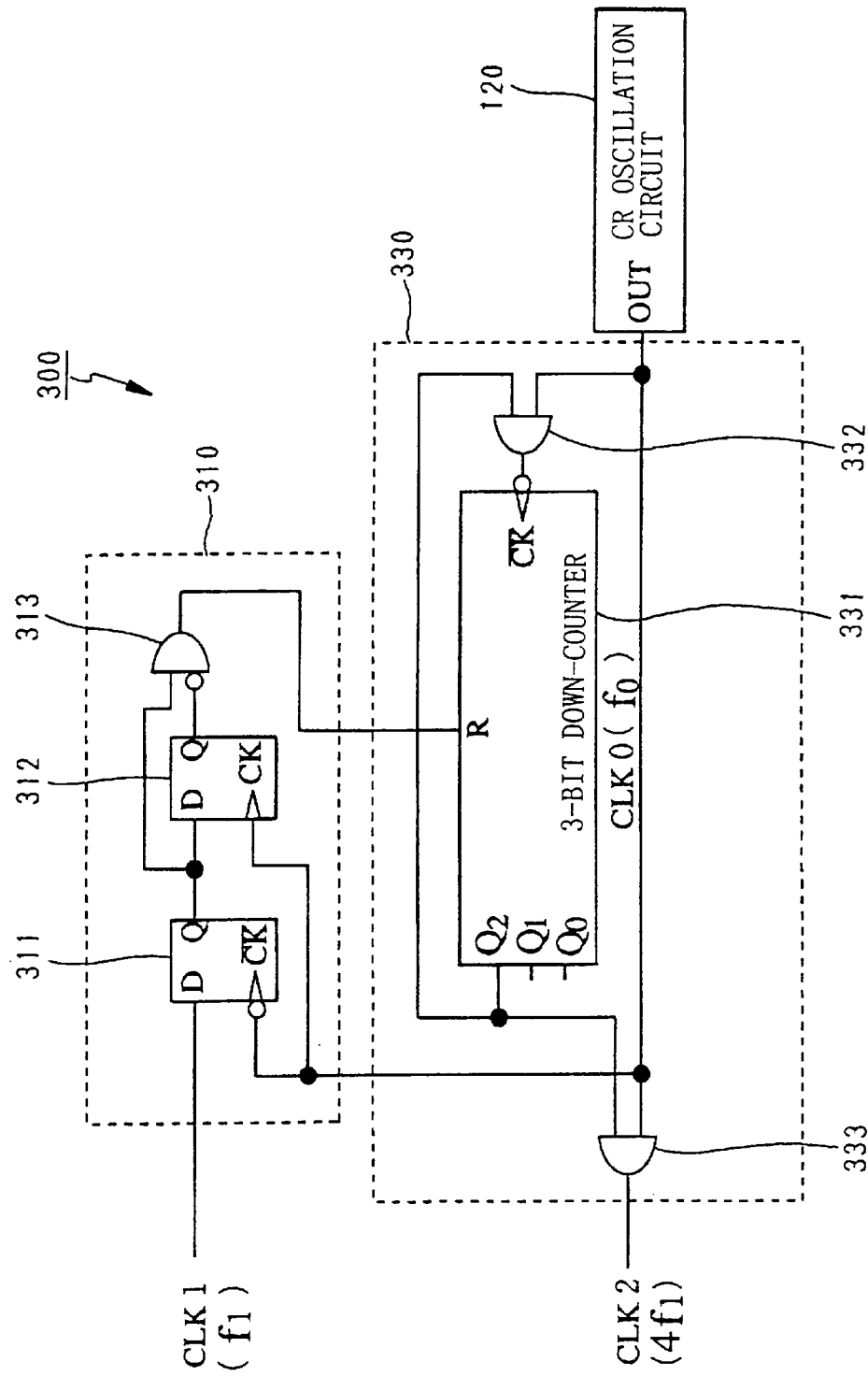
FIG. 3 is a circuit diagram illustrating a construction of the frequency multiplication circuit in a second embodiment.

FIG. 3 is a circuit diagram showing a construction of the frequency multiplication circuit in the second embodiment.

As shown in FIG. 3, a rising edge detection circuit 310 in a frequency multiplication circuit 300 includes delay-type flip-flops 311, 312 and a logic gate 313. Herein, the delay-type flip-flop 311 inputs the external clock signal CLK1 (with the frequency designated by "f1") from an input terminal D, and has the inversion clock input terminal CK(BAR) connected to the clock signal output terminal OUT of the CR oscillation circuit 120 (which will be mentioned later). The input terminal D of the delay-type flip-flop 312 is connected to the output terminal Q of the delay-type flip-flop 311, and the clock input terminal CK thereof is connected to the clock signal output terminal OUT of the CR oscillation circuit 120. The logic gate 313 includes an active-high input terminal connected to the output terminal Q of the delay-type flip-flop 311, and an active-low input terminal connected to the output terminal Q of the delay-type flip-flop 312, respectively. Then, this logic gate 313 is constructed to output the high-level signal only when the output Q of the delay-type flip-flop 311 takes the high level and when the output Q of the delay-type flip-flop 312 takes the low level, and to output the low-level signal in other cases. Then, an output of this logic gate 313 becomes an "edge detection signal" according to the present invention.

The CR oscillation circuit employed in the first embodiment discussed above is usable as an CR oscillation circuit 120. The clock signal CLK0 having the frequency f0, which is outputted by the CR oscillation circuit 120, serves as a "reference clock signal" according to the present invention.

A clock generation circuit 330 consists of a 3-bit down-counter 331 and AND gates 332, 333. Herein, a reset input terminal R of the down-counter 131 is connected to an output terminal of the logic gate 313 provided in a rising edge detection circuit 310, and a clock input terminal CK(BAR) thereof is connected to an output terminal of the AND gate 332. Then, one input terminal of the AND gate 332 is connected to a most-significant-bit output terminal Q2 of the down-counter 331, while the other output terminal thereof is connected to the output terminal OUT of the CR oscillation circuit 120. On the other hand, one input terminal of the AND gate 333 is connected to a most-significant-bit output terminal Q2 of the down-counter 331, while the other input terminal thereof is connected to the output terminal OUT of the CR oscillation circuit 120. Note that nothing is connected to the bit output terminals Q1, Q2 of the down-counter 331.

Next, an operation of the frequency multiplication circuit illustrated in FIG. 3 will be explained referring to a timing chart in FIG. 4.

Figure 4:
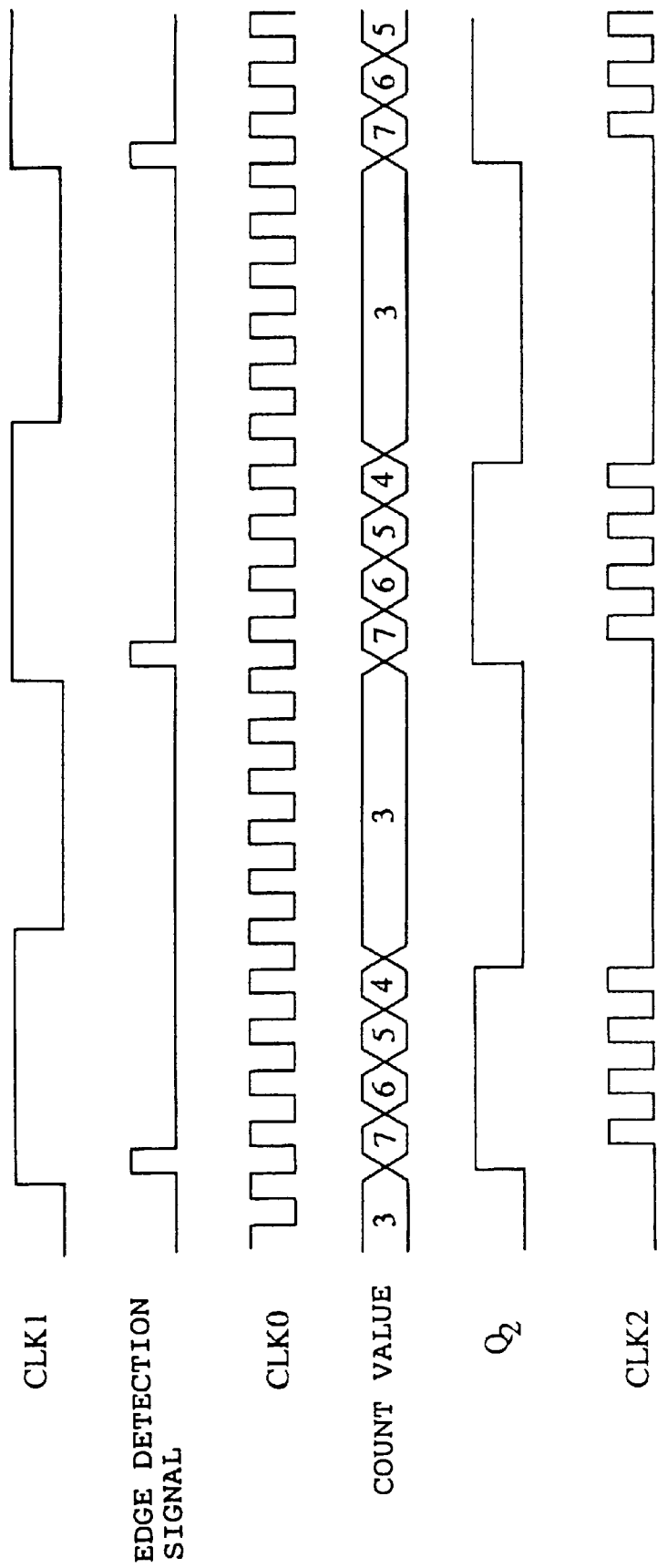
FIG. 4 is an explanatory timing chart showing an operation of the frequency multiplication circuit in a second embodiment.

As shown in FIG. 4, the CR oscillation circuit 120 generates and always outputs the reference clock signal CLK0 having the frequency f0 well higher than the frequency f1 of the external clock signal CLK1.

The delay-type flip-flop 311 of the rising edge detection circuit 310 takes in the external clock signal CLK1 at a fall timing of the reference clock signal CLK0. Further, the delay-type flip-flop 312 takes in the output Q of the delay-type flip-flop 311 at a rise timing of the reference clock signal CLK0. Accordingly, when delay-type flip-flop 311 takes in a new signal level of the external clock signal CLK1, it follows that the delay-type flip-flop 312 holds the signal level taken in last time by the delay-type flip-flop 311.

Therefore, when the signal level of the external signal CLK1 changes from high to low, the delay-type flip-flop 311 takes in the external clock signal CLK1 taking the low level at a fall timing of the first reference clock signal CLK0 after this change has occurred. On the other hand, the signal level held at this time by the delay-type flip-flop 312 is high. The output Q of the delay-type flip-flop 311 thereby becomes the low level, while the output Q of the delay-type flip-flop 312 becomes the high level. Therefore, the signal level of the edge detection signal outputted by the logic gate 313 becomes high.

Thereafter, when the delay-type flip-flop 311 again takes in the external clock signal CLK1 assuming the high level, both of the outputs Q of the delay-type flip-flops 311, 312 become the high level, and hence the signal level of the edge detection signal outputted by the logic gate 313 changes from high to low.

The down-counter 331 of the clock generation circuit 330 inputs the edge detection signal outputted by the logic gate 313 from the reset terminal. Then, a count value is reset at a rise timing of this edge detection signal. All the bit outputs Q0, Q1, Q2 of the down-counter 331 thereby take the high level (which corresponds to a count value "7").

The AND gate 332 inputs the output Q2 among those bit outputs from the input terminal, and inputs the reference clock signal CLK0 outputted by the CR oscillation circuit 120 from the other input terminal. Accordingly, when the output Q2 of the down-counter 331 is at the high level, the output of the AND gate 332 becomes the high level if the reference clock signal CLK0 is at the high level but the low level if at the low level. Namely, when the bit output Q2 of the down-counter 331 is at the low level, the reference clock signal CLK0 outputted by the CR oscillation circuit 120 is inputted directly to the clock input terminal CK(BAR) of the down-counter 331.

Further, the AND gate 333, as in the case of the AND gate 332, also inputs the output Q2 of the down-counter 331 from one input terminal, and inputs the reference clock signal CLK0 outputted by the CR oscillation circuit 120 from the other input terminal. Accordingly, when the output Q2 of the down-counter 331 is at the high level, the output of the AND gate 333 becomes the low level if the reference clock signal CLK0 is at the high level but the low level if at the low level. Namely, when the bit output Q2 of the down-counter 331 is at the low level, the reference clock signal CLK0 outputted by the CR oscillation circuit 120 is outputted directly from the output terminal of the AND gate 333 and becomes the output clock signal CLK2.

The down-counter 331 decrements the count value by "-1" at the fall timing of the reference clock signal CLK0 inputted from the clock input terminal CK(BAR). Then, this count value comes to "3" (viz., "011" in binary number), at which time the most-significant-bit output Q2 changes from the low level to the high level. The level of the signal supplied to one input terminal of the AND gate 332 thereby becomes low. Accordingly, the output of the AND gate 332 becomes the low level regardless of the signal level of the reference clock signal CLK0 outputted by the CR oscillation circuit 120. The down-counter 331 therefore stops counting.

Similarly, when the output Q2 of the down-counter 331 changes from the high level to the low level, the signal supplied to one input terminal of the AND gate 333 takes the high level, and hence the output of the AND gate 333 is fixed at the low level.

Thereafter, the rising edge detection circuit 310 again detects the rising edge of the external clock signal CLK2, and the down-counter 331 is reset. Thereupon, the down-counter 331 resumes the counting process in the same way as the above-mentioned, and the AND gate 333 resumes outputting the output clock signal CLK2.

Herein, the AND gate 333, as explained above, outputs the output clock signal CLK2 only when the output of the most significant bit Q2 of the down-counter 331 is at the low level, i.e., only when the count values are "7", "6", "5" and "4" ("111", "110", "101" and "011" in the binary numbers), and hence four clock signals are outputted during one period (1/f1) of the external clock signal CLK1. That is to say, the frequency multiplication circuit 300 illustrated in FIG. 3 is capable of generating the output clock signal CLK2 having the frequency 4f1 that is four times as high as the external clock signal CLK1.

Thus, the frequency multiplication circuit in the second embodiment is capable of downsizing the circuitry as in the first embodiment discussed above.

Further, what is the same as the first embodiment is that the frequency multiplication circuit can be constructed of only the digital circuits, and that the range of the frequency f1 of the external clock signal CLK1 can be widened.

Note that the counters having numbers of bits other than "3" in the second embodiment too are usable as in the first embodiment discussed above, and the AND gates 332, 333 can be controlled by using the outputs excluding the most significant bit.

Third Embodiment

Next, a third embodiment of the present invention will be described with reference to FIGS. 5 and 6.

Figure 5:
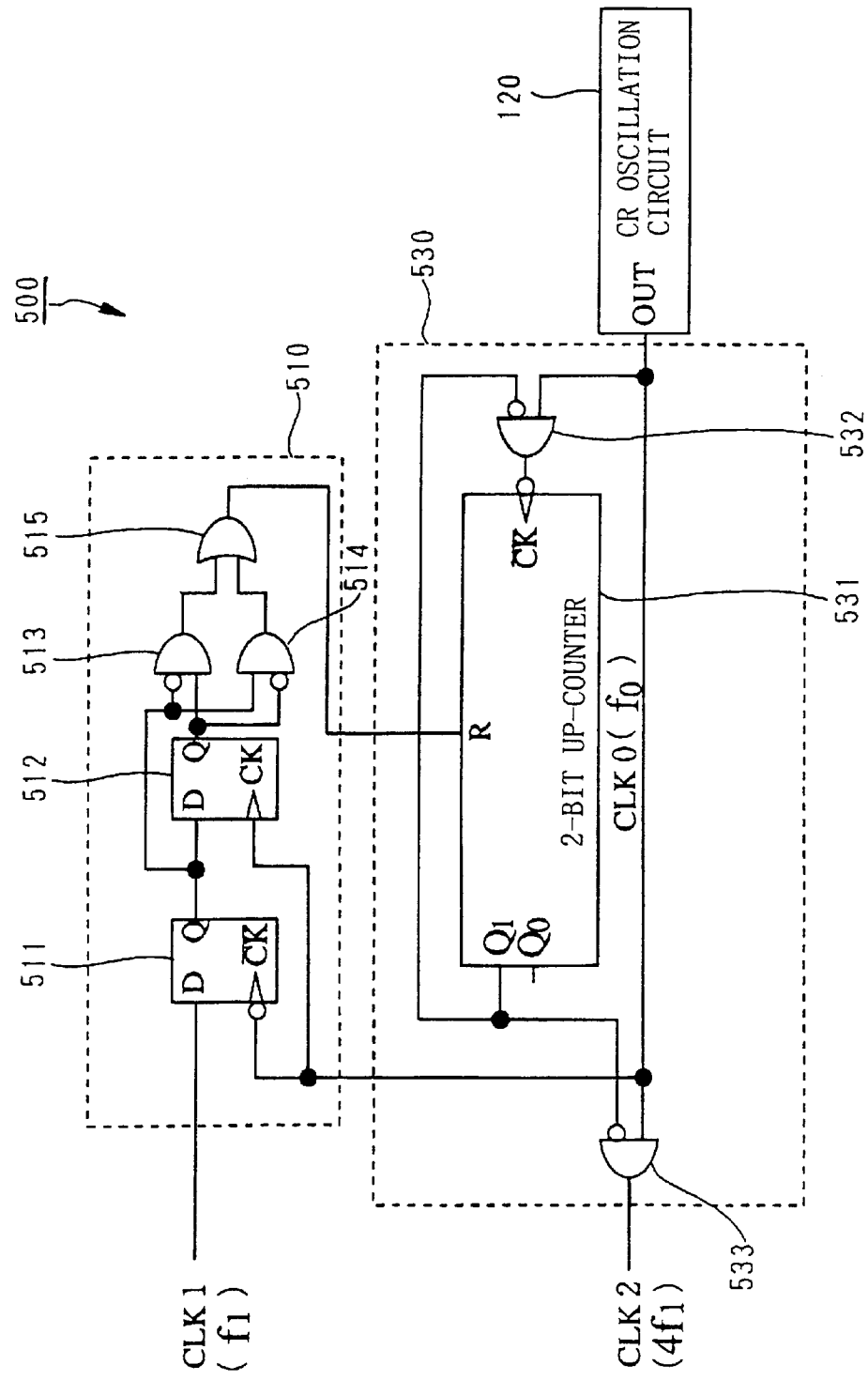
FIG. 5 is a circuit diagram illustrating a construction of the frequency multiplication circuit in a third embodiment.

FIG. 5 is a circuit diagram illustrating a construction of the frequency multiplication circuit in the third embodiment.

As shown in FIG. 5, a falling/rising edge detection circuit 510 in a frequency multiplication circuit 500 includes delay-type flip-flops 511, 512 and logic gates 513, 514, 515. Herein, the delay-type flip-flop 511 inputs the external clock signal CLK1 (with the frequency designated by "f1") from the input terminal D, and has the inversion clock input terminal CK(BAR) connected to the clock signal output terminal OUT of the CR oscillation circuit 120 (which will be mentioned later). The input terminal D of the delay-type flip-flop 512 is connected to the output terminal Q of the delay-type flip-flop 511, and the clock input terminal CK thereof is connected to the clock signal output terminal OUT of the CR oscillation circuit 120. The logic gate 513 includes an active-low input terminal connected to the output terminal Q of the delay-type flip-flop 511, and an active-high input terminal connected to the output terminal Q of the delay-type flip-flop 512, respectively. Then, an active-high input terminal of the logic gate 514 is connected to the output terminal Q of the delay-type flip-flops 511, and an active-low input terminal thereof is connected to the output terminal Q of the delay-type flip-flop 512, respectively. Furthermore, the output terminals of those logic gates 513, 514 are each connected to the input terminal of a logic gate (an OR gate) 515. Then, an output of the logic gate 515 serves as an "edge detection signal" according to the present invention.

The CR oscillation circuit 120 is constructed the same as the CR oscillation circuit 120 employed in the first embodiment discussed above, and its explanation is omitted. The clock signal CLK0 having the frequency f0, which is outputted by the CR oscillation circuit 120, serves as a "reference clock signal" according to the present invention.

A clock generation circuit 530 consists of a 2-bit up-counter 331 and logic gates 532, 533. Herein, a reset input terminal R of the up-counter 531 is connected to an output terminal of the logic gate 515 provided in a falling/rising edge detection circuit 510, and a clock input terminal CK(BAR) thereof is connected to an output terminal of the logic gate 532. Then, an active-low input terminal of this logic gate 532 is connected to a most-significant-bit output terminal Q1 of the up-counter 531, while an active-high output terminal thereof is connected to the output terminal OUT of the CR oscillation circuit 120. Herein, the logic gate 532 is constructed to output a high-level signal only when the output Q1 of the up-counter 531 is at the low level and when the reference clock signal CLK0 outputted by the CR oscillation circuit 120 is at the high level, and to output a low-level signal in other cases. On the other hand, an active-low input terminal of the logic gate 533 is connected to the most-significant-bit output terminal Q1 of the up-counter 531, while an active-high output terminal thereof is connected to the output terminal OUT of the CR oscillation circuit 120. This logic gate 533 is constructed to output a high-level signal only when the output Q1 of the up-counter 131 assumes the low level and when the reference clock signal CLK0 outputted by the CR oscillation circuit 120 assumes the high level, and to output a low-level signal in other cases. Incidentally, nothing is connected to the bit output terminal Q0 of the up-counter 531.

Next, an operation of the frequency multiplication circuit illustrated in FIG. 5 will be explained referring to a timing chart in FIG. 6.

Figure 6:
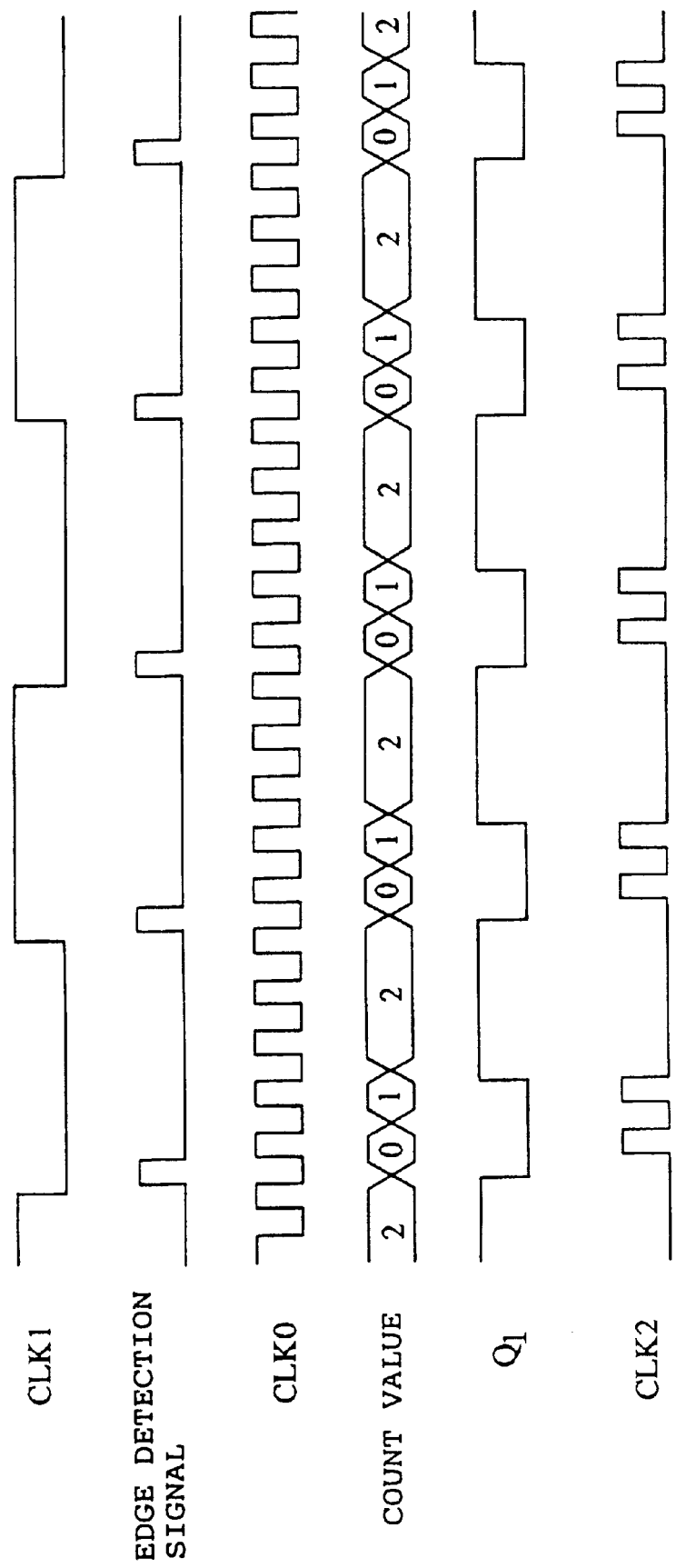
FIG. 6 is an explanatory timing chart showing an operation of the frequency multiplication circuit in a third embodiment.

As shown in FIG. 6, the CR oscillation circuit 120 generates and always outputs the reference clock signal CLK0 having the frequency f0 well higher than the frequency f1 of the external clock signal CLK1.

The delay-type flip-flop 511 of the falling/rising edge detection circuit 510 takes in the external clock signal CLK1 at the fall timing of the reference clock signal CLK0. Further, the delay-type flip-flop 512 takes in the output Q of the delay-type flip-flop 511 at a rise timing of the reference clock signal CLK0. Accordingly, a signal level of the external clock signal CLK1 taken in by the delay-type flip-flop 511, is then taken in by the delay-type flip-flop 512 after a passage of 1/(2f0).

Herein, supposing that the signal level of the external clock signal CLK1 taken in by the delay-type flip-flop 511 is consecutively high twice, both of the outputs Q of the delay-type flip-flops 511, 512 come to take the high level. Accordingly, both of the outputs of the logic gates 513, 514 become the low level, and hence a value of the edge detection signal outputted by the logic gate 515 also becomes the low level.

Next, assuming that the signal level of the external clock signal CLK1 changes from high to low, the delay-type flip-flop 511 takes in the external clock signal CLK1 taking the low level at a fall timing of the first reference clock signal CLK0 after this change has occurred. On the other hand, the signal level held at this time by the delay-type flip-flop 512 is high. The output of the logic gate 513 thereby becomes the high level, while the output of the logic gate 514 becomes the low level. Therefore, the edge detection signal outputted by the logic gate 515 takes the high level.

Subsequently, the output Q of the delay-type flip-flop 512 also takes the low level after the passage of 1/(2f0). After a further passage of 1(2f0), the delay-type flip-flop 111 again takes in the external clock signal CLK1 taking the low level. At this moment, both of the outputs Q of the delay-type flip-flops 511, 512 take the high level, and hence both of the outputs of the logic gates 513, 514 become the low level. Accordingly, the output of the logic gate 515 also changed to the low level.

Thereafter, when the signal level of the external clock signal CLK1 changes from low to high, the delay-type flip-flop 511 takes in the external clock signal CLK1 taking the high level at a fall timing of the first reference clock signal CLK0 after this change has occurred. On the other hand, the signal level held at this time by the delay-type flip-flop 512 is low. The output of the logic gate 513 thereby becomes the low level, while the output of the logic gate 514 becomes the high level. Therefore, the output of the logic agate 515 changes to the high level.

Then, the output Q of the delay-type flip-flop 512 also becomes the high level after the passage of 1/(2f0), and the delay-type flip-flop 511 again takes in the external clock signal CLK1 of the high level after a further passage of 1/(2f0). At this time, as both of the outputs Q of the delay-type flip-flops 511, 512 come to take the high level, both of the outputs of the logic gates 513, 514 become the low level. Accordingly, the output of the logic gate 515 changes to the low level.

The up-counter 531 of the clock generation circuit 530 inputs the edge detection signal outputted by the logic gate 515 from the reset terminal. Then, a count value is reset at a rise timing of this edge detection signal. Both of bit outputs Q0, Q1 of the up-counter 531 thereby take the low level.

The logic gate 532 inputs the output Q1 among those bit outputs from the active-low input terminal, and inputs the reference clock signal CLK0 outputted by the CR oscillation circuit 120 from the active-high input terminal. Accordingly, when the output Q1 of the up-counter 531 is at the low level, the reference clock signal CLK0 outputted by the CR oscillation circuit 120 is inputted directly t the clock input terminal CK of the up-counter 531.

Further, the logic gate 533, as in the case of the logic gate 532, also inputs the output Q1 of the up-counter 531 from the active-low input terminal, and inputs the reference clock signal CLK0 outputted by the CR oscillation circuit 120 from the active-high input terminal. Accordingly, when the output Q1 of the up-counter 531 is at the low level, the reference clock signal CLK0 outputted by the CR oscillation circuit 120 is outputted directly from the output terminal of the logic gate, and becomes an output clock signal CLK2.

The up-counter 531 increments the count value by "+1" at the fall timing of the reference clock signal CLK0 inputted from the clock input terminal CK(BAR). Then, this count value comes to "2" (viz., "10" in binary number), at which time the output Q1 changes from the low level to the high level. The output of the logic gate 532 is thereby fixed at the low level irrespective of the signal level of the reference clock signal CLK0 outputted by the CR oscillation circuit 120, and no output clock signal CLK2 is outputted.

Thereafter, the falling/rising edge detection circuit 510 again detects the falling or rising edge of the external clock signal CLK2, and the up-counter 531 is reset. Thereupon, the up-counter 531 resumes the counting process in the same way as the above-mentioned, and the logic gate 533 resumes outputting the output clock signal CLK2.

Herein, the logic gate 533, as explained above, outputs the output clock signal CLK2 only when the output is of the most significant bit Q1 of the up-counter 531 is at the low level, i.e., only when the count values are "0" and "1" ("000" and "001" in the binary numbers), and hence two clock signals, i.e., one-period (1/f1) clock signals are outputted during half of one period (½f1) of the external clock signal CLK1. That is to say, the frequency multiplication circuit 500 illustrated in FIG. 5 is capable of generating the output clock signal CLK2 having the frequency (4f1) that is four times as high as the external clock signal CLK1.

Thus, although the frequency multiplication circuit in the third embodiment involves the increase in the number of the logic gates (the logic gates 514, 515 f the falling/rising edge detection circuit 510 are newly required), the 4-multiplication frequency multiplication circuit can be actualized by use of the 2-bit up-counter 513. It is therefore feasible to downsize the circuitry smaller than in the first and second embodiments discussed above.

Incidentally, what is the same as the first embodiment is that the frequency multiplication circuit can be constructed of only the digital circuits, and that the range of the frequency f1 of the external clock signal CLK1 can be widened.

Further, in the third embodiment also, the number of bits of the counter is not limited as in the first embodiment discussed above, and the logic gates 132, 133 can be controlled by use of outputs exclusive of the most significant bits.

Fourth Embodiment

Subsequently, a fourth embodiment of the present invention will be described with reference to FIGS. 7 and 8. A frequency multiplication circuit in the fourth embodiment is different from the frequency multiplication circuit 100 in the first embodiment given above in terms of a construction of the clock generation circuit.

Figure 7:
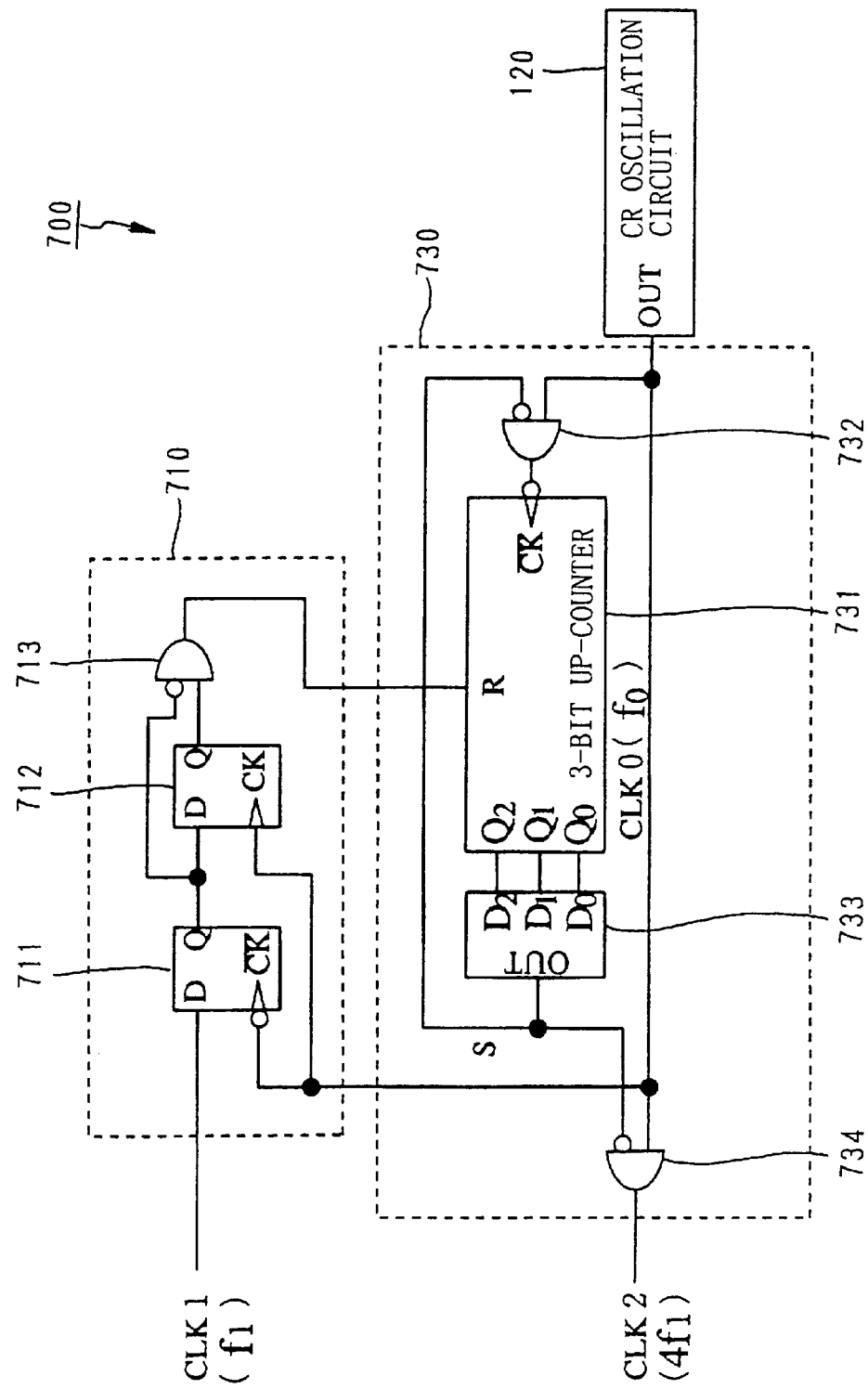
FIG. 7 is a circuit diagram illustrating a construction of the frequency multiplication circuit in a fourth embodiment.
Figure 8:
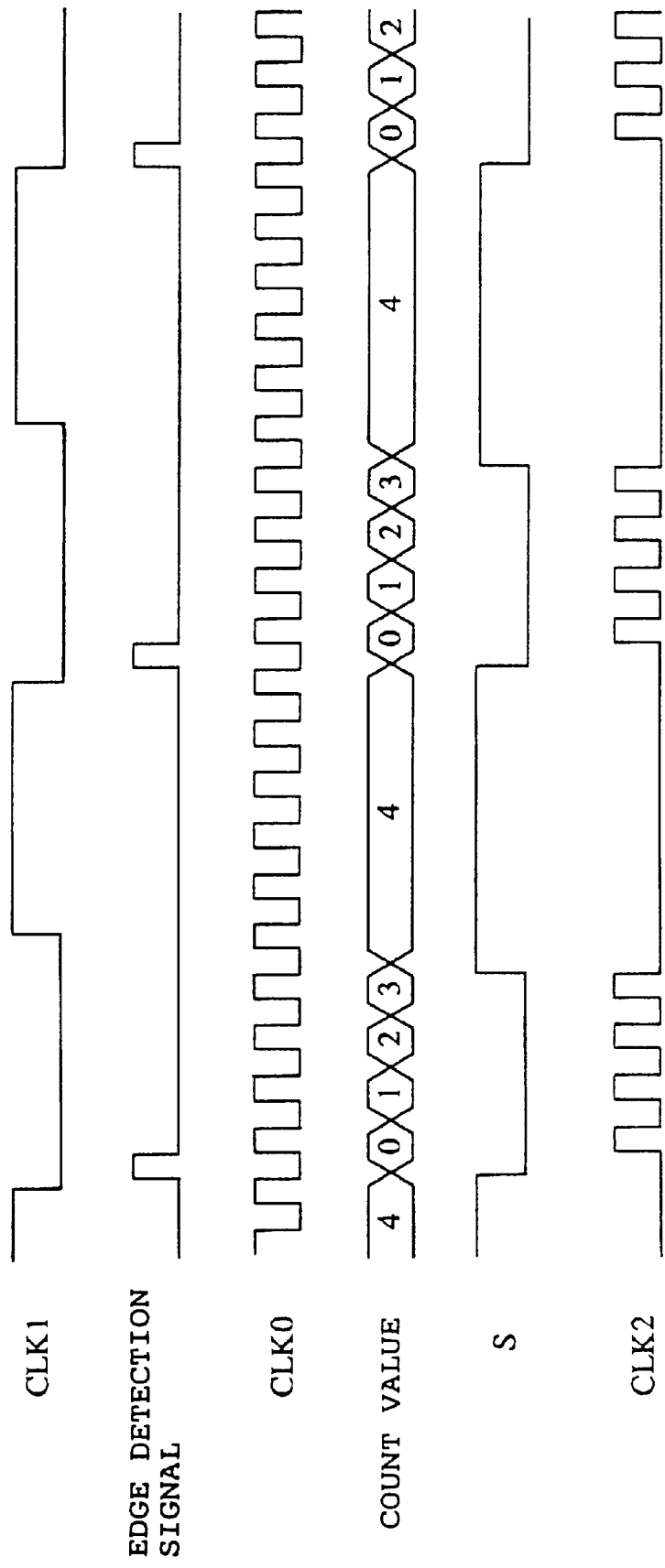
FIG. 8 is an explanatory timing chart showing an operation of the frequency multiplication circuit in a fourth embodiment.

FIG. 7 is a circuit diagram illustrating a construction of a frequency multiplication circuit 700 in the fourth embodiment.

Referring to FIG. 7, the components marked with the same numerals as those in FIG. 1 indicate the components identical with those in FIG. 1, and there explanations thereof are omitted.

A clock generation circuit 730 consists of a 3-bit up-counter 731, a decoder 732, and logic gates 733, 734.

Herein, a reset input terminal R of the up-counter 731 is connected to an output terminal of the logic gate 713 provided in a falling edge detection circuit 710, and 3-bit output terminals Q0, Q1, Q2 are connected respectively to data input terminals D0, D1, D2 of the decoder 733. Further, a clock input terminal CK(BAR) is connected to the output terminal of the logic gate 732.

Then, an active-low input terminal of this logic gate 732 is connected to an output terminal OUT of the decoder 733, and an active-high input terminal is connected to an output terminal OUT of the CR oscillation circuit 120, respectively. Furthermore, the active-low input terminal of the logic gate 734 is also connected to the output terminal OUT of the decoder 733, and the active-high input terminal is connected to the output terminal OUT of the CR oscillation circuit 120.

The decoder 733 is constructed to set an output signal S at a high level, which is outputted from the output terminal OUT when count results outputted by the up-counter 731 via the output terminals Q0, Q1, Q2 are "4" (i.e., "100" in the binary number), and to set the output signal S at the low level in other cases.

Next, an operation of the frequency multiplication circuit illustrated in FIG. 7 will be explained referring to a timing chart in FIG. 8.

The falling edge detection circuit 710 detects a falling edge of the external clock CLK1 as in the same way with the first embodiment, and outputs a pulse-like edge detection signal from the logic gate 713.

The up-counter 731 of the clock generation circuit 730 inputs the edge detection signal outputted by the logic gate 713 from the reset terminal. Then, a count value is reset at a rise timing of this edge detection signal. The count value of this u-counter 731 comes to "0", and therefore the output signal S of the decoder 733 becomes the low level.

The logic gate 732 inputs the output signal S of the decoder 733 from an active-low input terminal, and inputs the reference clock signal CLK0 outputted by the CR oscillation circuit 120 from an active-high input terminal. Accordingly, when the output signal S of the decoder 733 is at the low level, the reference clock signal CLK0 outputted by the CR oscillation circuit 120 is outputted directly from the output terminal of the logic gate 734, and becomes an output clock signal CLK2.

The up-counter 731 increments the count value by "+1" at the fall timing of the reference clock signal CLK0 inputted from the clock input terminal CK. Then, this count value comes to "4" (viz., "100" in binary number), at which time the output signal S of the decoder 733 changes from the low level to the high level. The output of the logic gate 732 thereby becomes the low level irrespective of the signal level of the reference clock signal CLK0 outputted by the CR oscillation circuit 120. Therefore, since the input signal from the clock input terminal CK is fixed at the low level, the up-counter 731 stops counting.

Similarly, when the output signal S of the decoder 733 becomes the high level, the output of the logic gate 734 is also fixed at the low level regardless of the signal level of the reference clock signal CLK0 outputted by the CR oscillation circuit 120., and no output clock signal CLK2 is outputted.

Thereafter, the falling edge detection circuit 710 again detects the falling edge of the external clock signal CLK2, and the up-counter 731 is reset. Thereupon, the up-counter 731 resumes the counting process in the same way as the above-mentioned, and the logic gate 734 resumes outputting the output clock signal CLK2.

In accordance with the fourth embodiment also, as in the same way with the first embodiment discussed above, the output clock signal CLK2 is outputted only when the count values are "0", "1", "2" and "3", and hence four clock signals are outputted during one period (1/f1) of the external clock signal CLK1. That is to say, the frequency multiplication circuit 700 illustrated in FIG. 7 is capable of generating the output clock signal CLK2 having the frequency (4f1) that is four times as high as the external clock signal CLK1.

Thus, the frequency multiplication circuit in the fourth embodiment can be, as in the first embodiment, downsized in circuitry smaller than the prior art frequency multiplication circuits.

Further, what is the same as the first embodiment is that the frequency multiplication circuit can be constructed of only the digital circuits, and that the range of the frequency f1 of the external clock signal CLK1 can be widened.

Note that the counters having numbers of bits other than "3" in the fourth embodiment too are usable as in the first embodiment discussed above, and the logic gates 732, 734 can be controlled by using the outputs excluding the most significant bit.

Fifth Embodiment

Next, a fifth embodiment of the present invention will be described with reference to FIGS. 9 and 10. A frequency multiplication circuit in the fifth embodiment is different from the frequency multiplication circuit 100 in the first embodiment given above in terms of a construction of the clock generation circuit.

Figure 9:
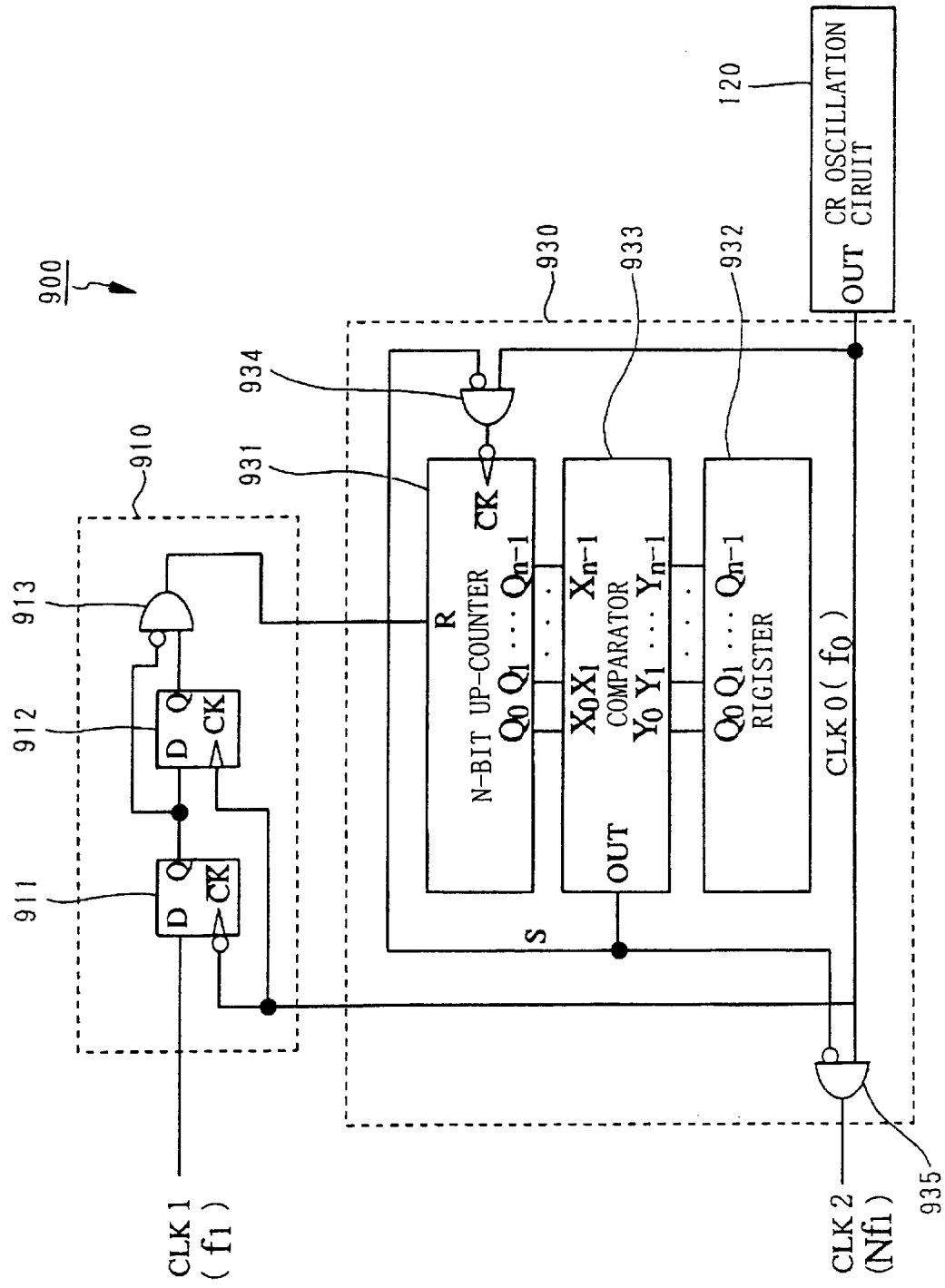
FIG. 9 is a circuit diagram showing a construction of the frequency multiplication circuit in a fifth embodiment.
Figure 10:
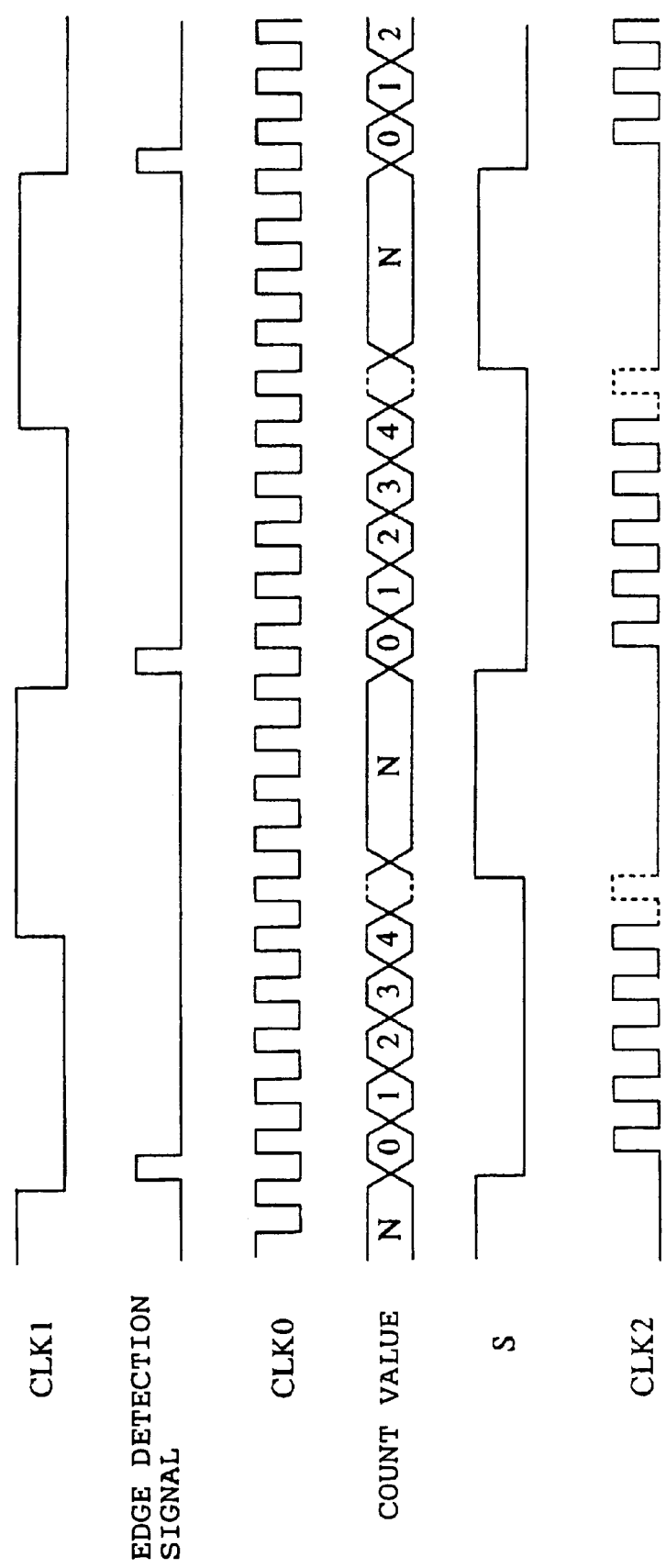
FIG. 10 is an explanatory timing chart showing an operation of the frequency multiplication circuit in a fifth embodiment.
Figure 11:
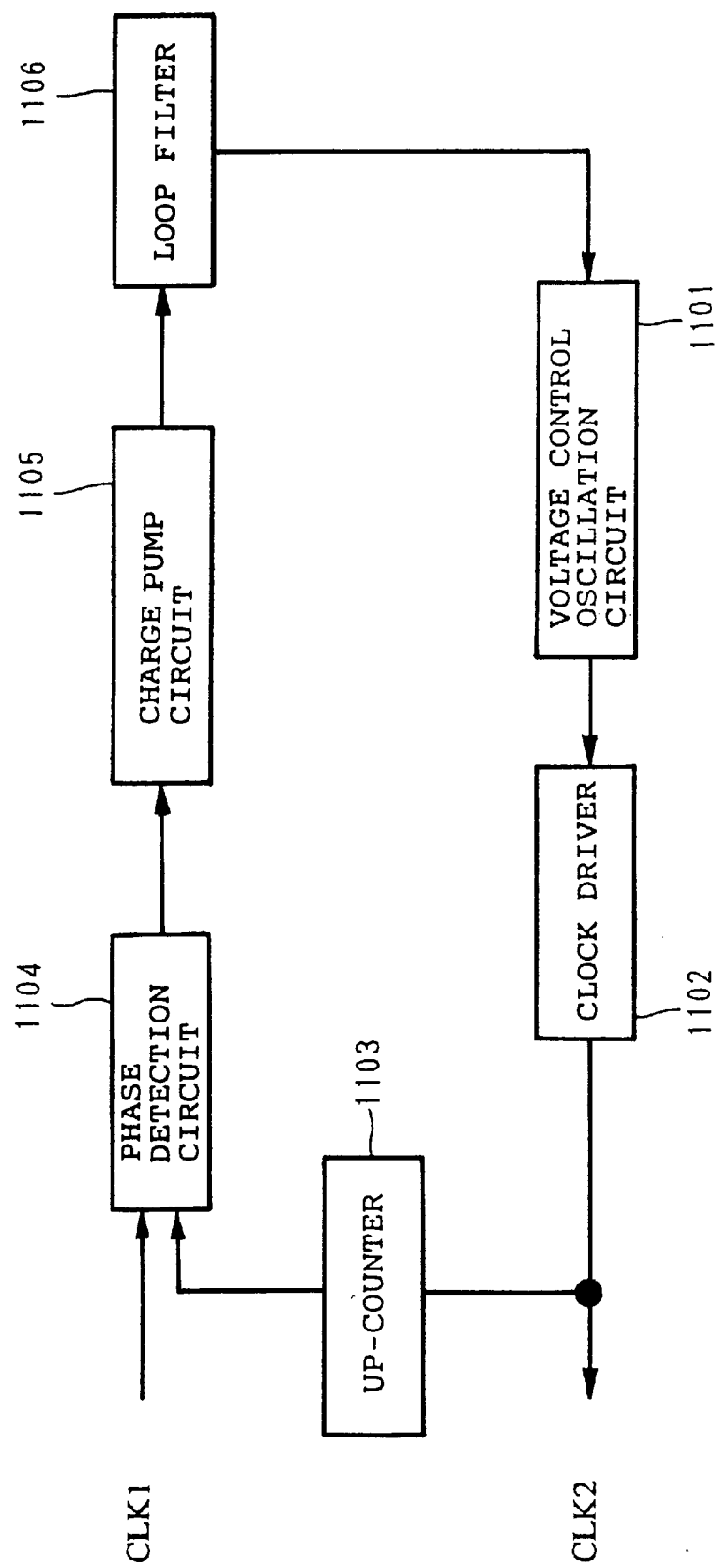
FIG. 11 is a block diagram showing one example of a construction of a prior art frequency multiplication circuit.

FIG. 9 is a circuit diagram illustrating a construction of a frequency multiplication circuit 900 in the fifth embodiment.

Referring to FIG. 9, the components marked with the same numerals as those in FIG. 1 indicate the components identical with those in FIG. 1, and there explanations thereof are omitted.

A clock generation circuit 930 consists of an N-bit up-counter 931, an N-bit register 932, a comparator, and logic gates 934, 935.

A reset input terminal R of the up-counter 931 is connected to an output terminal of the logic gate 913 provided within a falling edge detection circuit 910, and N-bit output terminal Q0, Q1, ..., $Q_{N-1}$ are connected respectively to data input terminal X0, X1, ..., $X_{N-1}$ of the comparator 933. Further, a clock input terminal CK(BAR) is connected to an output terminal of the logic gate 934.

Further, the output terminals Q0, Q1, ..., $Q_{N-1}$ of the register 932 are connected respectively to data input terminals Y0, Y1, ..., $Y_{N-1}$ of the comparator 933.

Then, an active-low input terminal of this logic gate 934 is connected to the output terminal OUT of the comparator 933, and an active-high input terminal is connected to the output terminal OUT of the CR oscillation circuit 120, respectively. Further, the active-low input terminal of the logic gate 935 is connected to the output terminal OUT of the comparator 933, while an active-high input terminal is connected to the output terminal OUT of the CR oscillation circuit 120.

Herein, the register 932 is constructed so that an unillustrated data writing device is capable of freely writing N-bit data.

Further, the comparator 933 is constructed to compare the N-bit data inputted from the data input terminals X0, X1, ..., $X_{N-1}$ with the N-bit data inputted from the input terminals Y0, Y1, ..., $Y_{N-1}$. The comparator 933 is also constructed to, if two items of data are coincident with each other, set the output signal S at the high level and, whereas if not coincident, set the output signal S at the low level.

Next, an operation of the frequency multiplication circuit shown in FIG. 9 will be explained with reference to a timing chart in FIG. 10.

To start with, the unillustrated writing device writes a compared value (which is herein "N") to the register 932. This register 932 outputs this compared value "N" from output terminals Q0, Q1, ..., $Q_{N-1}$ at all times. With this processing, this compared value "N" is always outputted to the data input terminals Y0, Y1, ..., $Y_{N-1}$ of the comparator 933.

Subsequently, the falling edge detection circuit 910, as in the same way with the first embodiment, starts detecting the falling edge of the external clock CLK1. Then, when detecting the falling edge, a pulse-like edge detection signal is outputted from the logic gate 913.

The up-counter 931 of the clock generation circuit 930 inputs the edge detection signal outputted by the logic gate 913 from the reset terminal. Then, a count value is reset at a rise timing of this edge detection signal. With this processing, the count value of the up-counter 931 becomes "0", and this count value "0" is outputted to the data input terminals XO, X1, ..., $X_{N-1}$ of the comparator 933 from the N-bit output terminals Q0, Q1, ..., $Q_{N-1}$.

The comparator 933 compares the count value "0" inputted from the data input terminals XO, X1, ..., $X_{N-1}$ with the compared value "N" inputted from the input terminals Y0, Y1, ..., $Y_{N-1}$. Herein, the values of the two items of data are not coincident with each other, and hence the output signal S of the comparator 933 becomes the low level.

The logic gate 934 inputs the output signal S of the comparator 933 from the active-low input terminal, and inputs the reference clock signal CLK0 outputted by the CR oscillation circuit 120 from the active-high input terminal.

Accordingly, when the output signal S of the comparator 933 is at the low level, the reference clock signal CLK0 is inputted directly to the clock input terminal CK(BAR) of the up-counter 931.

Further, the logic gate 935 also inputs, as in the case of the logic gate 934, the output signal S of the comparator 933 from the active-low input terminal, and inputs the reference clock signal CLK0 outputted by the CR oscillation circuit 120 from the active-high input terminal. Accordingly, when the output signal S of the comparator 933 is at the low level, the reference clock signal CLK0 outputted by the CR oscillation circuit 120 is outputted directly from the output terminal of the logic gate 934, and becomes an output clock signal CLK2.

The up-counter 931 increments the count value by "+1" at the fall timing of the reference clock signal CLK0 inputted from the clock input terminal CK. Then, this count value becomes "N", and it follows that it coincides with the compared value stored in the register 932. Therefore, the comparator 933 changes the output signal S from the high level to the low level. An output f the logic gate 934 thereby becomes the low level regardless of the signal level of the reference clock signal CLK0 outputted by the CR oscillation circuit 120. The input signal from the clock input terminal CK is fixed at the low level, and the up-counter 931 therefore stops counting.

Similarly, when the output signal S of the comparator 933 takes the low level, the output of the logic gate 935 is also fixed at the low level irrespective of the signal level of the reference clock signal CLK0 outputted by the CR oscillation circuit 120, and no output clock signal CLK2 is outputted.

Thereafter, the falling edge detection circuit 910 again detects the falling edge of the external clock signal CLK2, and the up-counter 931 is reset. Thereupon, the up-counter 931 resumes the counting process in the same way as the above-mentioned, and the logic gate 935 resumes outputting the output clock signal CLK2.

In accordance with the fifth embodiment, the output clock signal CLK2 is outputted only when the count values are "0"–"N", and hence N-pieces of clock signals are outputted during one period (1/f1) of the external clock signal CLK1. Namely, the frequency multiplication circuit 900 illustrated in FIG. 9 is capable of generating the output clock signal CLK2 having a frequency (Nf1) that is N-times as high as the external clock signal CLK1.

Thus, the frequency multiplication circuit in the fifth embodiment is capable of determining a multiple based on the compared value stored in the register 932. Herein, since the register 932 is classified as the N-bit register, values of 0 through $2^N$ can be designated as compared values. Hence, in accordance with the fifth embodiment, the multiple is changeable within this range.

Further, what is the same as the embodiments discussed above is that the frequency multiplication circuit can be downsized smaller than the prior art frequency multiplication circuit, that the same circuit can be constructed of only the digital circuits, and that the range of the frequency f1 of the usable external clock signal CLK1 can be widened.

As discussed above in greater detail, according to the present invention, it is feasible to provide the frequency multiplication that can be downsized and constructed of only the digital circuits and has the wide range of frequency of the usable external clock signal.

It is apparent that, in this invention, a wide range of different working modes can be formed based on the invention without deviating from the spirit and scope of the invention. This invention is not restricted by its specific working modes except being limited by the appended claims.

What is claimed is:

1. A frequency multiplication circuit for generating an output clock signal having a frequency obtained by multiplying an external clock signal inputted from outside by a predetermined number, said circuit comprising:

an edge detection circuit for detecting a signal edge of the external clock signal and outputting an edge detection signal;

an oscillation circuit for generating and outputting a reference clock signal having a predetermined frequency; and a clock generating circuit for taking in the edge detection signal outputted by said edge detection circuit and the reference clock signal outputted by said oscillation circuit, counting the number of clocks of the reference clock signal, directly outputting the reference clock signal before the number of clocks reaches a predetermined number, outputting no reference clock signal after the number of clocks has reached the predetermined number, and resetting a process of counting the number of reference clocks when inputting the edge detection signal.

2. The frequency multiplication circuit according to claim 1, wherein said edge detection circuit periodically detects a signal level of the external clock signal at a timing given by the reference clock signal outputted by said oscillation circuit, and detects a falling edge by outputting the edge detection signal when the signal level detected this time is a low level and when the signal level detected last time is a high level.

3. The frequency multiplication circuit according to claim 1, wherein said edge detection circuit periodically detects a signal level of the external clock signal at a timing given by the reference clock signal outputted by said oscillation circuit, and detects a falling edge by outputting the edge detection signal when the signal level detected this time is a high level and when the signal level detected last time is a low level.

4. The frequency multiplication circuit according to claim 1, wherein said edge detection circuit periodically detects a signal level of the external clock signal at a timing given by the reference clock signal outputted by said oscillation circuit, and detects a falling edge and a rising edge by outputting the edge detection signal when the signal level detected this time is different from the signal level detected last time.

5. The frequency multiplication circuit according to claim 2, wherein said edge detection circuit comprises:

a first delay-type flip-flop for periodically taking in the external clock signal at a timing given by the reference clock signal outputted by said oscillation circuit;

a second delay-type flip-flop for periodically taking in an output signal of said first delay-type flip-flop at a timing delayed by half a period from the timing at which said first delay-type flip-flop takes in the external clock signal; and a logic circuit for turning ON the edge detection signal when an output of said first delay-type flip-flop is at a low level and when an output of said second delay-type flip-flop is at a high level.

6. The frequency multiplication circuit according to claim 3, wherein said edge detection circuit comprises:

a first delay-type flip-flop for periodically taking in the external clock signal at a timing given by the reference clock signal outputted by said oscillation circuit;

a second delay-type flip-flop for periodically taking in an output signal of said first delay-type flip-flop at a timing delayed by half a period from the timing at which said first delay-type flip-flop takes in the external clock signal; and a logic circuit for turning ON the edge detection signal when an output of said first delay-type flip-flop is at a high level and when an output of said second delay-type flip-flop is at a low level.

7. The frequency multiplication circuit according to claim 4, wherein said edge detection circuit comprises:

a first delay-type flip-flop for periodically taking in the external clock signal at a timing given by the reference clock signal outputted by said oscillation circuit;

a second delay-type flip-flop for periodically taking in an output signal of said first delay-type flip-flop at a timing delayed by half a period from the timing at which said first delay-type flip-flop takes in the external clock signal; and a logic circuit for turning ON the edge detection signal when an output of said first delay-type flip-flop and an output of said second delay-type flip-flop have different signal levels.

8. The frequency multiplication circuit according to claim 1, wherein said clock generating circuit comprises:

a counter for inputting the edge detection signal from a reset terminal;

a first logic circuit for supplying a clock input terminal of said counter with the reference clock signal only when a count value of said counter does not reach a predetermined value; and a second logic circuit for outputting the reference clock signal as an output clock signal to outside only when the count value of said counter does not reach the predetermined value.

9. The frequency multiplication circuit according to claim 8, wherein a detection of whether or not the count value of said counter reaches the predetermined value is judged from a signal level of predetermined bits of said counter.

10. The frequency multiplication circuit according to claim 9, wherein said counter is a down-counter, and the signal level of the predetermined bits is a high level.

11. The frequency multiplication circuit according to claim 9, wherein said counter is an up-counter, and the signal level of the predetermined bits is a low level.

12. The frequency multiplication circuit according to claim 8, wherein whether or not the count value of said counter reaches the predetermined value is detected by a decoder posterior to each bit of said counter.

13. The frequency multiplication circuit according to claim 8, further, in order to detect whether or not the count value of said counter reaches the predetermined value, comprising:

storage means for storing the predetermined value; and a comparator for comparing the predetermined value inputted from said storage means with the count value inputted from said counter and, when the two values are coincident with each other, turning ON an output signal.

14. The frequency multiplication circuit according to claim 1, wherein said oscillation circuit is an astable multivibrator.

* * * * *